United States Patent [19]

Kitaya et al.

[11] Patent Number: 4,975,860
[45] Date of Patent: Dec. 4, 1990

[54] APPARATUS FOR AUTOMATICALLY DRAWING A DOT PATTERN

[75] Inventors: Katsuhiko Kitaya, Tokyo, Japan; Katsuya Uehara, Lexington, Ky.; Yoshimitsu Matsushita, Kanagawa, Japan

[73] Assignee: Nippon Sheet Glass Co., Ltd., Osaka, Japan

[21] Appl. No.: 260,397

[22] Filed: Oct. 20, 1988

[30] Foreign Application Priority Data

Oct. 23, 1987 [JP] Japan ................................. 62-267972

[51] Int. Cl.$^5$ ............................................. G06F 15/62
[52] U.S. Cl. .................................. 364/520; 364/473; 364/474.28; 364/474.29
[58] Field of Search ........... 364/518, 520, 473, 474.03, 364/474.28, 474.29, 474.31; 340/728, 729, 793

[56] References Cited

U.S. PATENT DOCUMENTS

| 4,486,785 | 12/1984 | Lasher et al. | 340/793 X |
| 4,586,037 | 4/1986 | Rosener et al. | 340/728 |
| 4,591,843 | 5/1986 | Pratt | 340/793 X |
| 4,727,364 | 2/1988 | Vorst | 340/729 |

Primary Examiner—Dale M. Shaw
Assistant Examiner—Mark K. Zimmerman
Attorney, Agent, or Firm—Woodcock, Washburn, Kurtz, Mackiewicz & Norris

[57] ABSTRACT

An automatic drawing apparatus wherein coordinates of dots are determined on the basis of allocation data of unit dot patterns each consisting of one- or two-dimensional dot allocation and data of a reference line obtained by one-dimensionally allotting the unit dot patterns. A dot pattern is plotted on the basis of dot outline data and their coordinate data, thereby producing a high-precision pattern image within a very short period of time.

15 Claims, 11 Drawing Sheets

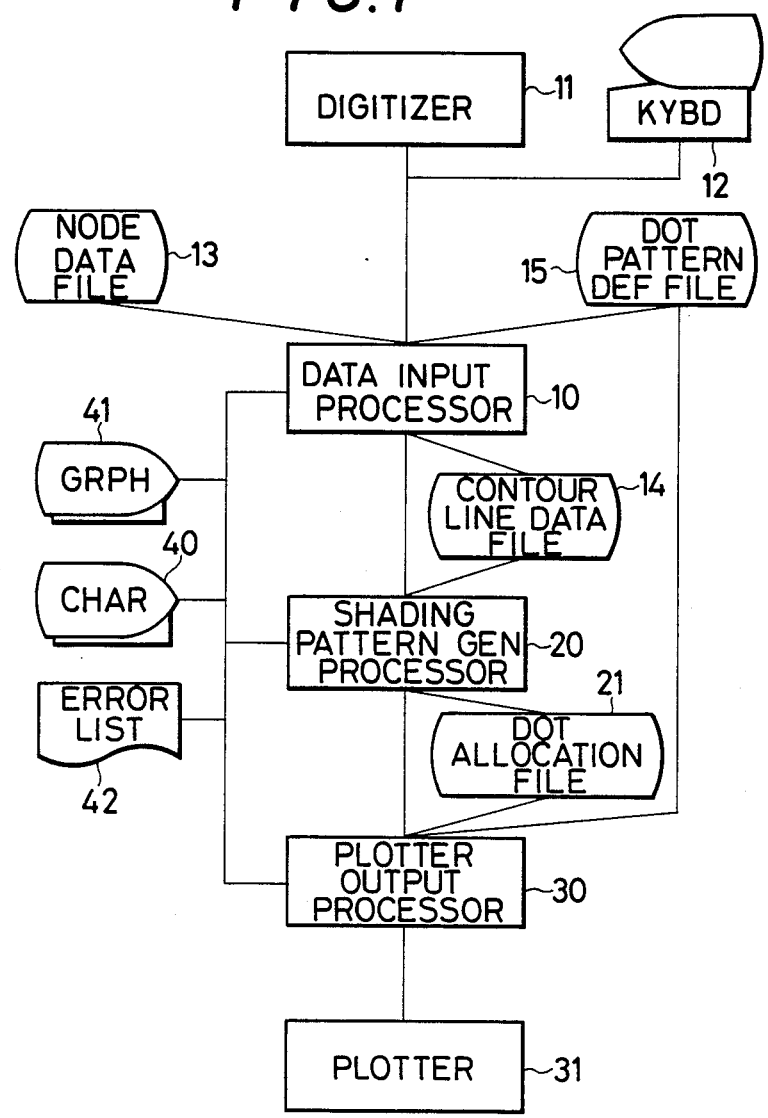

APPARATUS FOR AUTOMATICALLY DRAWING A DOT PATTERN

BACKGROUND OF THE INVENTION

1. Field of the Invention:

The present invention relates to an automatic drawing apparatus for a dot pattern and, more particularly, to an apparatus for producing an original pattern for a color print with a gradation area along an edge of a glass product.

2. Description of the Prior Art:

Color masking (dot pattern) with a gradation area along an edge of, e.g., a window glass of an automobile is often performed. Such masking is formed by, e.g., printing and baking a ceramic material. A print screen is prepared such that an original pattern is produced and formed as a positive film, and a positive image on the positive film is transferred to a photosensitive screen. The gradation area is generally expressed as a density of a large number of dots.

An original pattern must be manually prepared by skilled persons according to a conventional technique, resulting in time-consuming operations and high cost. In addition, it is difficult to prepare samples with a simple process, evaluate design, and change design specifications.

SUMMARY OF THE INVENTION

It is therefore an object of the present invention to produce a high-precision original matter by a computer-aided drafting system within a short period of time without requiring advanced skills, and to allow drafting of a dot pattern having a specific outline which has not been produced according to the conventional technique, thereby reducing the manufacturing cost and facilitating design evaluation and modifications.

In order to achieve the above object of the present invention, there is provided an apparatus for automatically drawing a dot pattern, comprising means for giving outline data of a single dot, means for giving allocation data defining one- or two-dimensional dot allocation for a unit dot pattern consisting of a small number of single dots, means for giving reference line data for one-dimensional allotment of the unit dot patterns along a reference line, means for equidistantly dividing the reference line and determining functions of normal lines to the reference line at divided points on the basis of the reference line data, means for determining two-dimensional coordinates of each dot so as to allot the unit dot patterns along the reference line and orient in a direction of the normal lines or a direction forming a predetermined angle with the norma, lines, on the basis of the normal line functions and the allocation data of the unit dot pattern, and means for forming the dot pattern on a drawing on the basis of the two-dimensional coordinates and the dot outline data.

According to the present invention, a dot outline, one- or two-dimensional allocation data of a unit dot pattern,.and reference line data for the one-dimensional allocation of unit dot patterns are defined to automatically produce a dot pattern. An original pattern can be produced using a small number of data within a short period of time. Therefore, the design can be easily modified and corrected.

The unit dot pattern may be a simple circle, a polygonal pattern (e.g., triangle, square, and star), and a pattern such as a character.

These and other objects of the invention will be seen by reference to the description, taken in connection with the accompanying drawings

BRIEF DESCRIPTION OF THE DRAWINGS

FIG. 1(A) is a schematic block diagram of an automatic dot pattern drafting apparatus according to an embodiment of the present invention;

DETAILED DESCRIPTION OF THE PREFERRED EMBODIMENT

Figure 2:
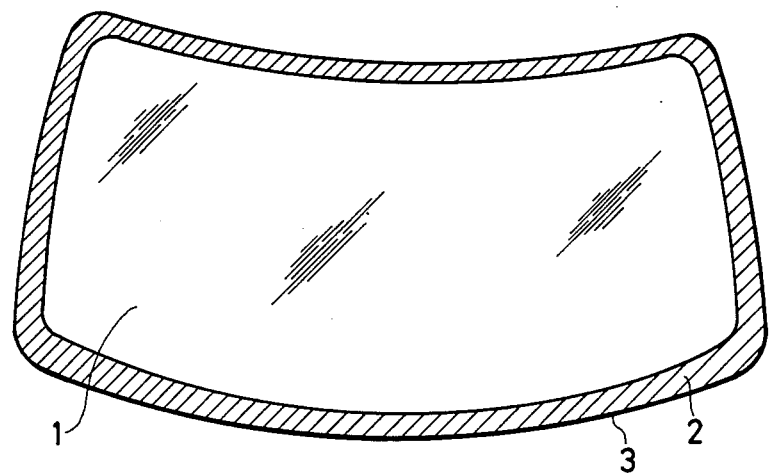
FIG. 2 is a front view of an automobile window glass on which a dot pattern is printed.
Figure 3:
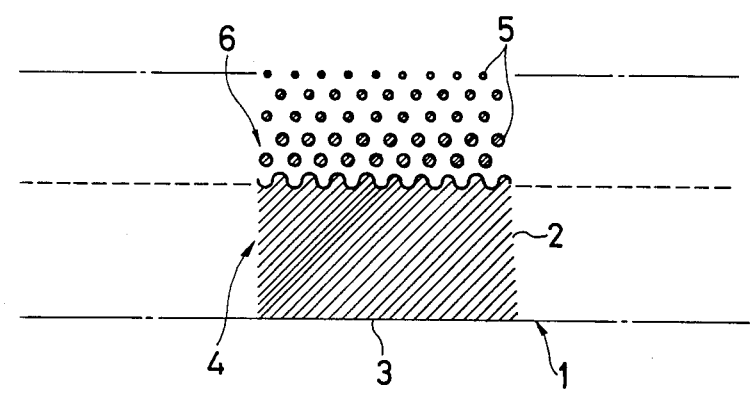
FIG. 3 is a detailed view of a shading pattern.

FIG. 1 shows a schematic arrangement of an automatic dot pattern drawing apparatus according to an embodiment of the present invention. A pattern to be drawn by this apparatus is a shading or gradation pattern for edging or framing along an edge of a surface of an article If an article is a transparent article such as an automobile window glass 1 as shown in FIG. 2, the shading or gradation pattern may be called an edging mask pattern A shading pattern 2 formed along the edge of the window glass 1 shown in FIG. 2 comprises a solid area 4 along an edge 3 and a gradation area 6 consisting of regular allocation of dots 5, as shown in a magnified view of FIG. 3. The gradation area 6 is expressed by a density of large and small dots 5. A transmittance of the gradation area is continuously changed toward the center.

The main component of the drawing system shown in FIG. 1 is a computer which includes a plurality of program modules and a plurality of data files. Each program module is regarded as a special-purpose data processor. Therefore, the program module is referred to as a processor hereinafter. A data input processor 10, a shading pattern generation processor 20, and a plotter output processor 30, all of which are sequentially started, constitute the system shown in FIG. 1.

The data input processor 10 is a processor for processing input data for setting (designating) the outline of the shading pattern 2 and the outline of the dots 5. A digitizer 11 and a keyboard 12, both of which serve as user interfaces, are connected to the data input processor 10. By using an original drawing of a window glass written on a Mylar sheet, the digitizer 11 is used to sample the outline of the window glass 4 and boundary lines representing the outline of the shading pattern 2 by pointing (node-picking) along the outlines with small intervals enough to allow primary (linear) or secondary (curve) interpolation, and the converted data are input to the computer. The data input processor 10 generates a node data file 13 on the basis of the digitizer inputs and performs arc or linear interpolation between the nodes on the basis of a predetermined approximation algorithm to generate a contour line data file 14.

The keyboard 12 is used to input the outline (e.g., circle, triangle, or square) of each dot 5 and the number of dots and a reduction/magnification factor of a unit pattern constituted by dots 5. The data input processor 10 generates a dot pattern definition file 15 on the basis of the inputs from the keyboard 12.

The shading pattern generation processor 20 receives data from the contour line data file 14 and the dot pattern definition file 15 to generate dot allocation data in a two-dimensional coordinate system according to calculations, thereby generating a dot allocation file 21.

The plotter output processor 30 outputs drawing data to a plotter 31 on the basis of the dot allocation file 21 and the dot pattern definition file 15. The plotter 31 draws a dot pattern on a transparent film in accordance with each calculated dot allocation point, thereby generating an original drawing of the dot pattern.

A character display 40 and a graphic display 41 are arranged to monitor data inputs and the generated pattern. In addition, a line printer 42 (or a serial printer) is arranged to output a list of data inputs and operation errors.

Each processor will be described in detail below.

Figure 1B:
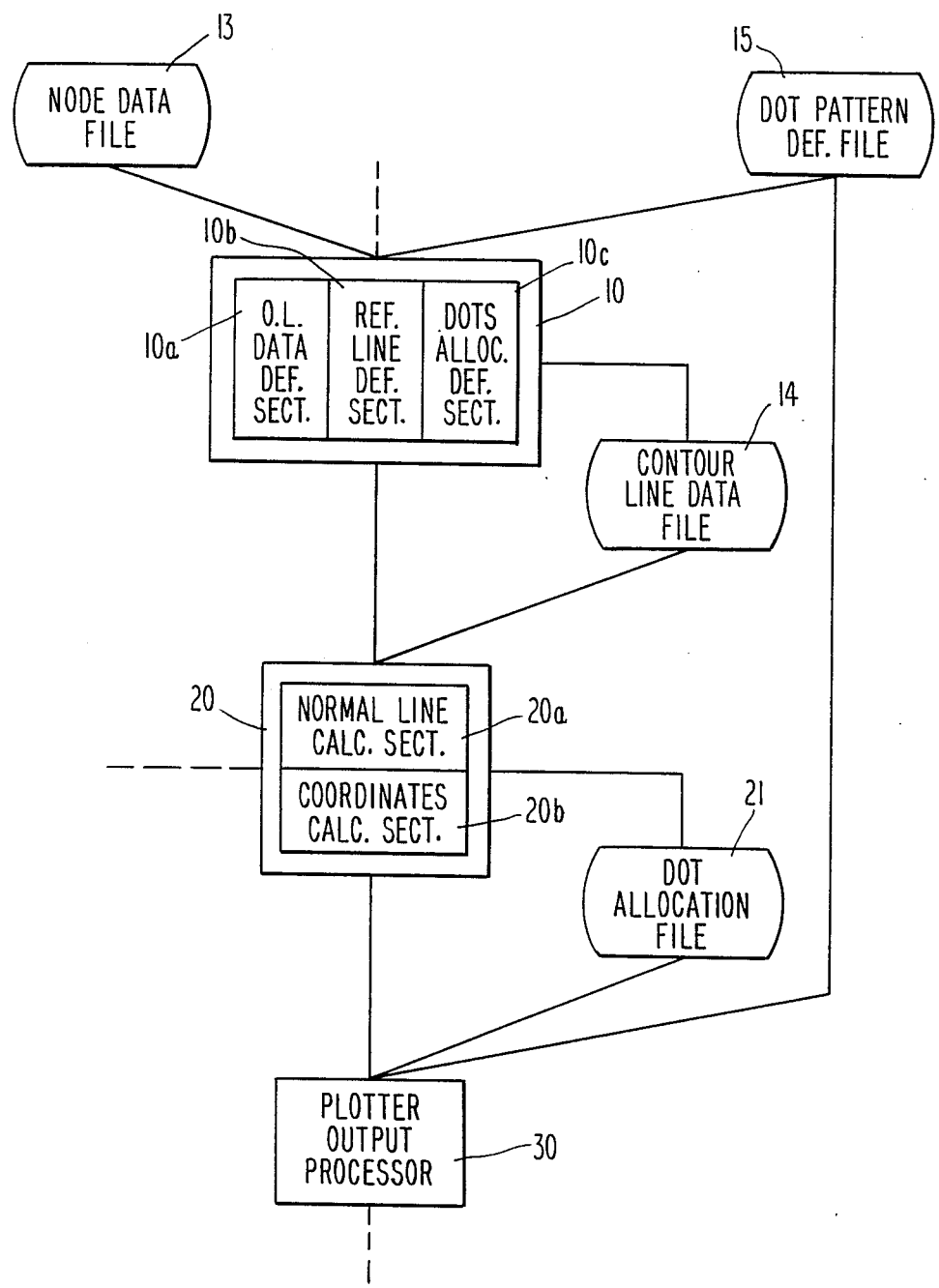
FIG. 1(B) is a more detailed block diagram of portions of the automatic dot pattern drafting apparatus of FIG. 1(A)

FIG. 1(B) shows blocks corresponding to fundamental functions of the processors 10 and 20 in FIG. 1(A). Input data processor 10 consists of an outline data definition section 10a for a single dot; a reference line data definition section 10b and a dot allocation data definition section for a unit dot pattern 10c.

The outline data definition section 10a gives outline data of a single dot to the plotter output processor 30. The dot allocation data definition section 10c gives data for defining a dots allocation for a unit pattern consisting of a small number of single dots to be located around an axis. The allocation data is fed to the shading pattern generation processor 20.

The reference line data definition section 10b gives reference line data to the shading pattern generation processor 20 which determines series alignment of the unit dot patterns along a reference line.

The shading pattern generation processor 20 consists of a calculation section 20a for calculating normal lines at equidistantly divided points along the reference line; and a coordinates calculation section 20b for calculating coordinates of dots of aligned unit dot patterns.

The calculation section 20a receives the reference line data from section 10b, equidistantly divides the reference line, and determines normal line functions of normal lines to the reference line at respective divided points.

The coordinates calculation section 20b receives data of the normal line functions from the calculation section 20a and the dots allocation data of the unit dot pattern from the definition section 10c; then determines two-dimensional coordinates of each dot to arrange unit dot patterns along the reference line with orientation of the axis of the dot pattern in directions of the normal lines or directions forming a predetermined angle with the normal lines; and then feeds two-dimensional coordinates data to the plotter output processor 30.

The drawing device 31 receives the two-dimensional coordinates and the outline data of the single dot from the plotter output processor 30, and draws a shading dot pattern along the reference line.

Figure 4:
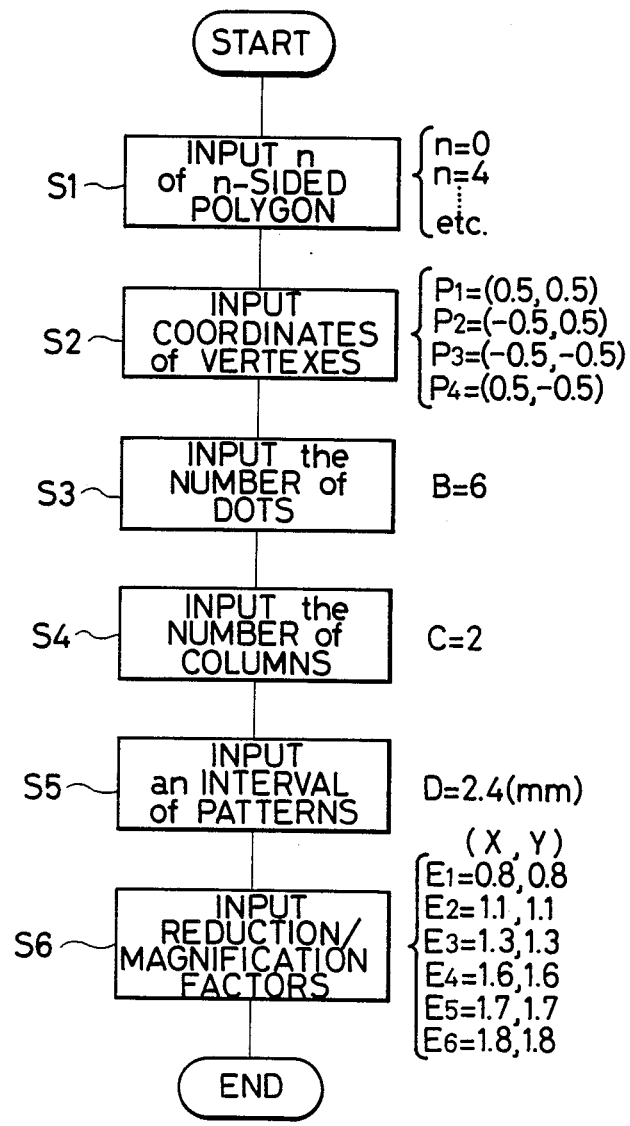
FIG. 4 is a flow chart for explaining an operation for inputting unit dot pattern data.
Figure 5:
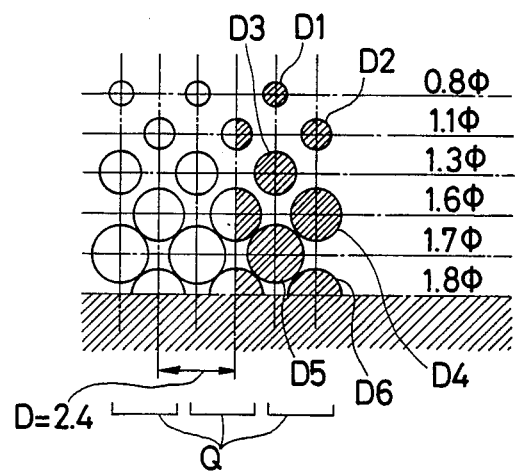
FIG. 5 is a view showing unit patterns constituted by circular dots.
Figure 6:
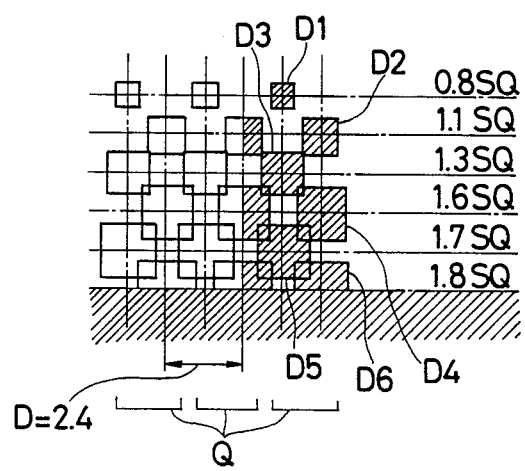
FIG. 6 is a view showing unit patterns constituted by square dots.

FIG. 4 is a flow chart showing input procedures of dot pattern specification data at the data input processor 10. FIG. 5 shows unit patterns consisting of circular dots. FIG. 6 shows unit patterns consisting of square dots. The shading pattern has a one-dimensional array consisting of repeated unit patterns.

The data input in FIG. 4 is performed in accordance with messages displayed on the character display 40. The number n of an n-sided polygon is input (step S1). If the square dot in FIG. 6 is used the number n is 4. However, if the circular dot in FIG. 5 is used, the number n is zero. The number n may be within the range of 3 to 36. Coordinates of vertexes of one polygon are input (step S2). If the polygon is a square, four points P1 to P4, i.e. coordinates $(0.5,0.5)$, $(-0.5,0.5)$, $(-0.5,-0.5)$, and $(0.5,-0.5)$ with respect to origin coordinates $(0,0)$ are input. However, if the circle dot is input, a diameter is input in place of the coordinates of the vertexes. A polygonal dot may have any outline if it can be written with one outline having no intersection points. For example, a polygonal dot may be a star or a letter such as N. The number B of dots within one unit pattern is input (step S3). In the case of FIG. 5 or 6, B=6. However, the number B can be increased up to 24.

The number C of columns within one unit pattern is input (step S4). In the case of FIG. 5 or 6, C=2. However, the number C can be increased up to 4. When the numbers B and C are determined, the dot allocation of the unit pattern is determined. That is, in the patterns in FIGS. 5 and 6, unit patterns Q are defined such that dots are allotted on alternate columns from the inner side to the outer side (i.e., downward in FIGS. 5 and 6) and are equidistantly spaced apart in a direction normal to the contour line, as indicated by D1, D2,... D6.

A pattern pitch D, i.e., a pitch between the unit patterns Q along the contour line tangential direction is input. In the patterns in FIGS. 5 and 6 D=2.4 mm. Therefore, a column interval is D/2=1.2 mm.

Figure 7:
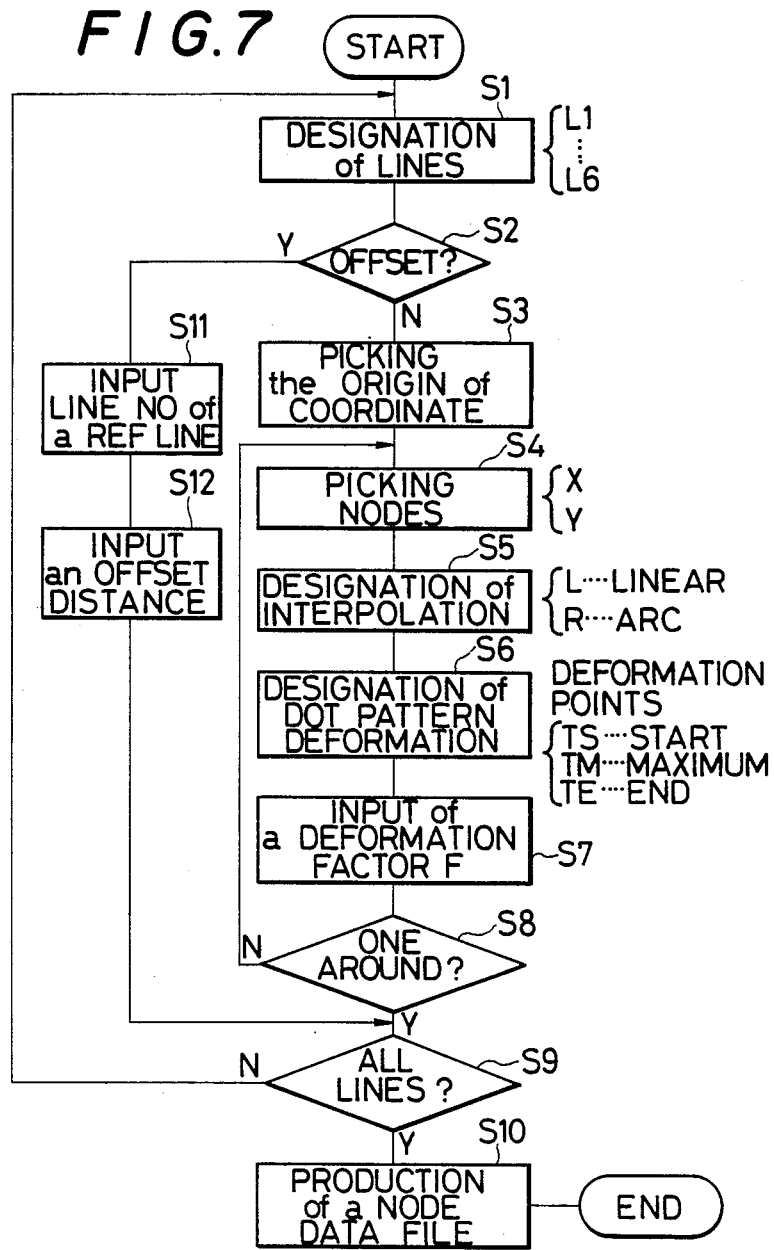
FIG. 7 is a flow chart for explaining an operation for inputting contour line data.
Figure 8:
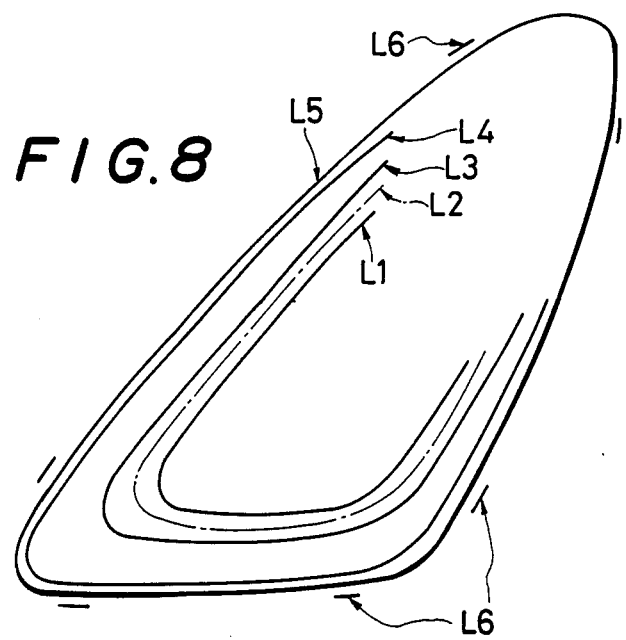
FIG. 8 is a view showing contour lines of the window glass.

Reduction and magnification factors of the dots D1 to D6 within the unit pattern are input (step S6). The reduction and magnification factors are scale factors when the coordinate values of the dot outline input in step S2 are given as reference values. In this case, the reduction and magnification factors can be independently designated along the X direction (i.e., the shading tangential line direction) and the Y direction (shading normal line direction). For example, E1(X)=0.8 and E2(Y)=0.8 can be designated for the first dot D1. The dots can be magnified or reduced as similar dots, or fat or thin dots. In order to apply a "gradation‘ effect to the shading pattern, the scale factor is gradually increased from the inside of the shading pattern to the outside. As shown in the pattern of FIG. 6, dots may partially overlap each other due to magnifying operations without problems FIG. 7 is a flow chart for explaining input procedures of contour line data in the data input processor 10. FIG. 8 is a front view of a window glass (rear quarter glass of an automobile) representing a plurality of shading edges required for generating a shading pattern.

There are six contour lines in FIG. 8. Some necessary contour lines are written on a Mylar original drawing without reduction or magnifying. Reference symbol L1 denotes a dot area innermost line which contacts the innermost dot of the dot pattern. Reference symbol L2 denotes a dot area reference line along which generation of dot pattern data is performed in a manner to be described later. Reference symbol L3 denotes a dot area outermost line. Dot allocation is determined such that the center of the innermost dot of the dot pattern is located on the dot area outermost line L3.

The dot pattern is generated on the basis of geometrical data of the contour lines L1 to L3. According to a pattern generation algorithm, the dot area reference line L2 is equidistantly divided by 1/C (where C is the number of columns) of the pattern pitch D input in FIG. 4 normal lines are drawn at individual divided points, and a distance between the dot area innermost line L1 and the dot area outermost line L3 is equidistantly divided by the number B of dots, thereby determining coordinates of centers of the respective dots.

Reference symbol L4 denotes a solid area outermost line. An area between the dot area outermost line L3 and the solid area outermost line L4 is a solid area. Reference symbol L5 denotes a glass outline; and L6, a position reference line which is used for registration between the window glass and the print screen.

Figure 9:
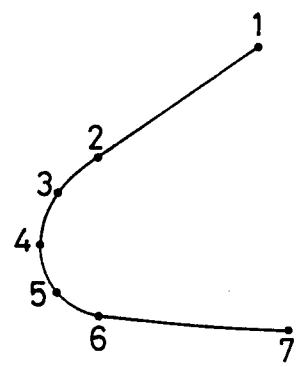
FIG. 9 is a view showing nodes for digitizing a contour line.

Coordinates of a large number of sampling points (node array) on the contour lines L1 to L6 in FIG. 8 are digitized by the digitizer 11, as shown in FIG. 9. A point between the sampling points is interpolated by an approximation function to generate the contour line data file 14. Node data can be fetched as follows. As shown in FIG. 7, one of the lines L1 to L6 are designated (step S1). In step S2, it is determined in step S2 whether line data are calculated by offset calculations. If NO in step S2, the origin of coordinates is picked upon by the digitizer 1 (step S3). A large number of nodes along the contour line are picked, and node data are digitized (step S4). Each node data consists of X- and Y-coordinates. A linear (L) or arc (R) interpolation is designated upon every node picking (step S5).

If the designated line is the dot area reference line L2 or an original line when the dot area reference line is generated by offset, dot pattern deformation is designated at a curved portion of a glass corner (step S6). That is, the dot allocation internal is decreased at the inside of the curved portion along the contour line, a scale factor of 1 or less is multiplied with the dot outline data at the time of generation of the shading pattern. Dot pattern deformation is designated such that a node of interest is a deformation start point (TS), a deformation maximum point (TM), or a deformation end point (TM). In step S7, a deformation factor F (F<1) is input. This deformation factor is a maximum deformation factor. The deformation factor is automatically calculated to be smoothly changed in an order of 1, F, and 1 from the deformation start point to the deformation end point at the curved portion.

Referring to FIG. 7, when digitization of a perimeter of one line is completed (step S8), the above operations are repeated for the remaining lines (step S9). When digitization of all lines is completed, the node data file 13 (FIG. 1) is produced in step (10.

If a given contour line is equidistantly spaced apart from other lines, the latter lines can be arithmetically and internally calculated by using a math function. For example, if the solid area outermost line L4 is equidistantly spaced apart from the glass outermost line L5, only the glass outermost line L5 is subjected to digitization. If the distance between the dot area innermost/outermost line L1/L3 and the dot area reference line L2 is equidistant, only the dot area reference line L2 is subjected to digitization. Therefore, the contour lines generated by the offset calculations need not be written in the original drawing. However, if a glass plate has a corner having a very small radius of curvature, offset calculations cannot be performed at a corner portion. In this case, all lines must be input by digitization.

Referring to FIG. 7, when digitization is performed by offset calculations, the flow is branched from step S2 to step S11. In this step, the line numbers L1 to L5 of a reference line for offset are input, and an offset distance is input in step S12.

The intervals between the nods (sampling points) during digitization are about 50 mm for a curved contour line having a large radius of curvature and 3 to 10 mm for a curved contour line having a small radius of curvature. In the latter curved contour, the interval is determined in accordance with the magnitude of the radius of curvature.

Typically, the dot area reference line L2 is preferably located at a position inside the dot area outermost line L3 by 1/5 (normally about 0.5 mm) of a gradation width (i.e., a distance between the dot area innermost/outermost lines L1 and L3). For example, if the radius of curvature of the dot area innermost line L1 of the corner of a minimum radius in the window glass is twice that of the gradation width, the outline data of the dot area reference line L2 can be calculated by the node data of L3 (or L1) such that the reference line L2 is located inside at a predetermined distance from the dot area outermost line L3. However, if the radius of curvature of the dot area innermost line L1 of the corner of a minimum radius is less than twice that of the gradation width, the dot area reference line L2 is determined at a position near the corner away from the dot area outermost line L3 by 0.4 to 0.45 times of the gradation width.

Figure 10:
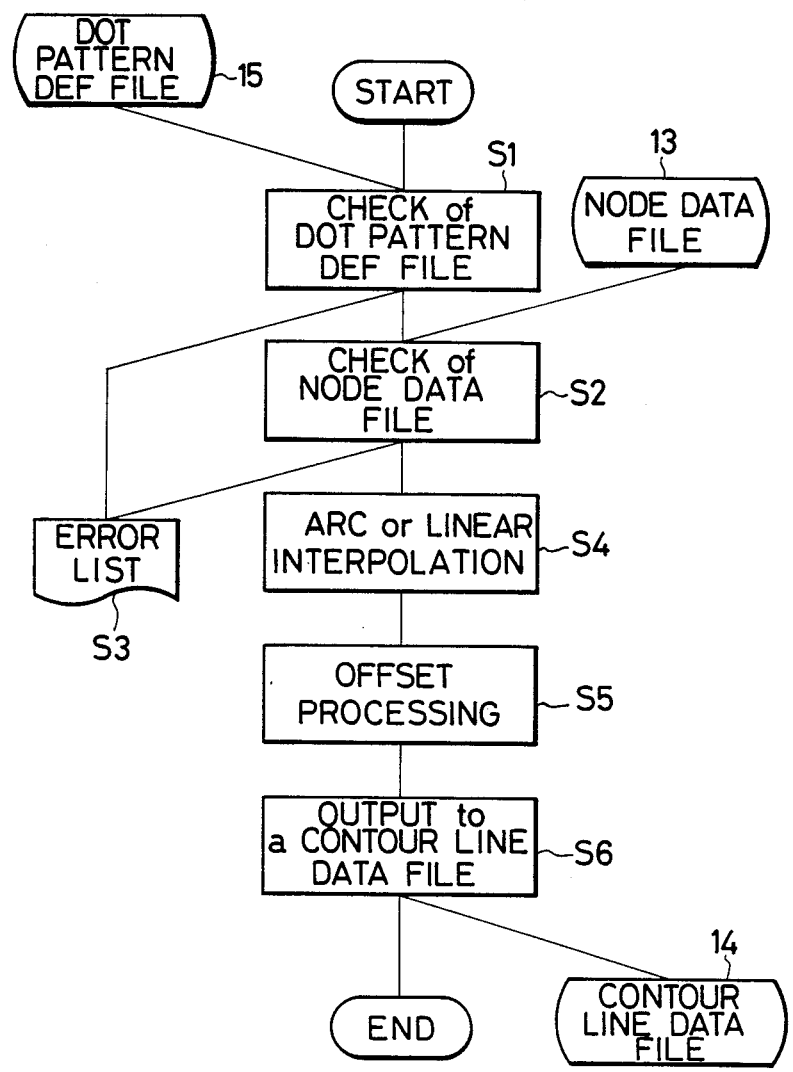
FIG. 10 is a flow chart for generating contour line data.

FIG. 10 is a flow chart showing a routine for producing the contour line data file 14 in the data input processor 10 in FIG. 1. In check steps S1 and S2, the dot pattern definition file 15 and the node data file 13 are checked. If an error is detected, an error signal is output in step S3. Linear or arc interpolation between the adjacent nodes is performed in step S4. That is, parameters of the arc or linear function are generated on the basis of the coordinate data at both end points. For example, in arc interpolation, X- and Y-coordinates of the center of the circle, the start and end nodes of an arc, and central angles of the nodes serve as parameters.

Arc and linear data offset from the reference line by a predetermined distance are generated for the offset-designated line in step S5. When the above operations are completed, data is written in the contour line data file 14 in step S6.

Figure 11:
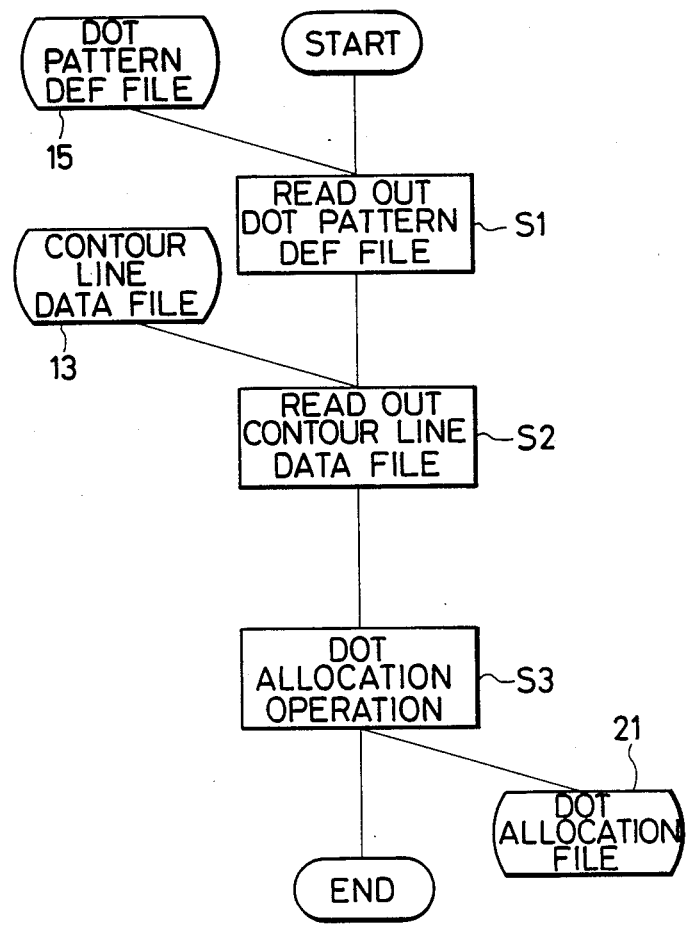
FIG. 11 is a flow chart for generating a shading pattern.

The shading pattern generation processor 20 in FIG. 1 will be described in detail below. In this pattern generation processing, as shown in the flow chart of FIG. 11, in steps S1 and S2, the data are read out from the dot pattern definition file 15 and the contour data file 13.

The dot allocation is calculated in step S3 to generate the dot allocation file 21 representing individual points (coordinates) of the shading pattern.

Figure 12:
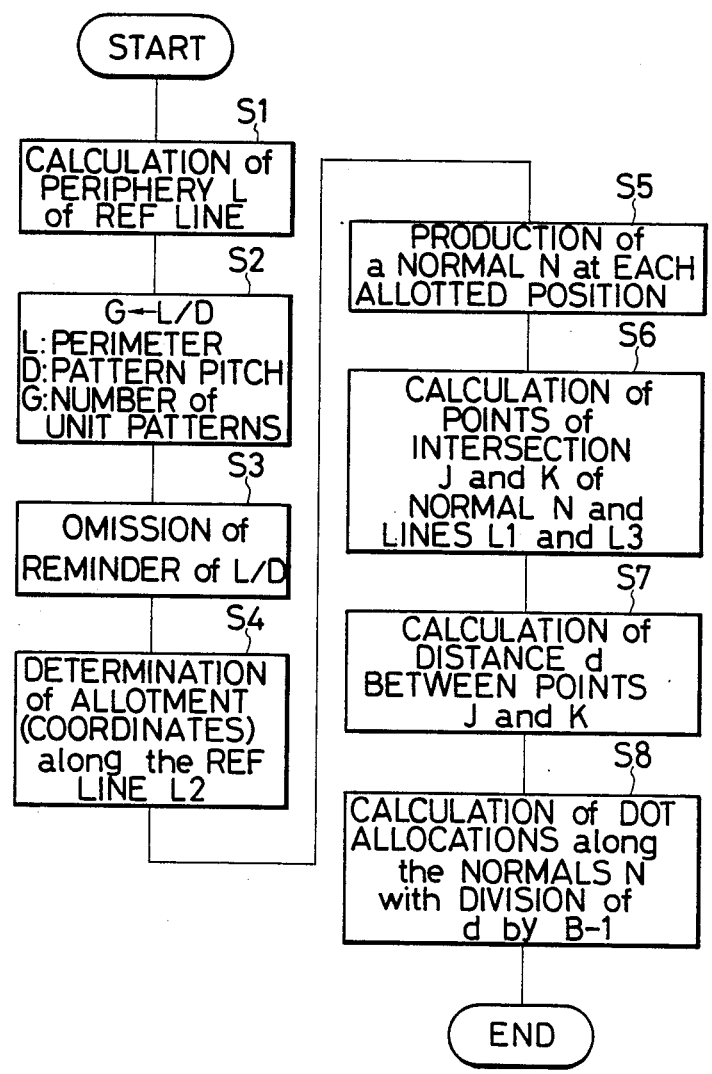
FIG. 12 is a flow chart for determining a dot allocation position.
Figure 13:
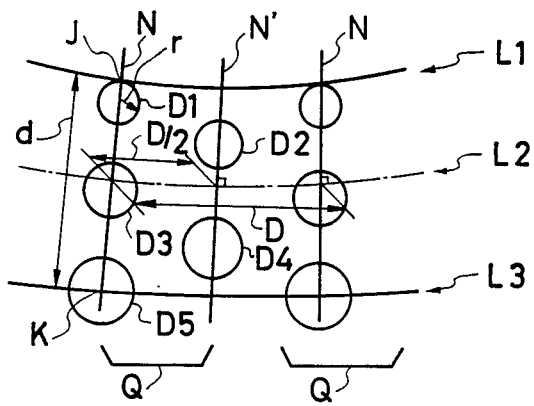
FIG. 13 is a view showing dot allocation.

A dot allocation algorithm is shown in the flow chart of FIG. 12. FIG. 13 is a detailed view showing the dot allocation. A perimeter L of the dot area reference line L2 is calculated in step S1. The perimeter L is divided by the data input pattern pitch D of FIG. 4 to obtain the number G of unit patterns along the dot area reference line L2. In this case, if the remainder is obtained in the division (step S2), the remainder is omitted, so that the number G is set to be an integer (step S3). The reference dot patterns can be uniformly allotted along the periphery of the dot area reference line L2.

Coordinates of the allotted positions of the unit dot pattern at a pitch of L/G are obtained [step S4). In step S5, normals N to the dot area reference line L2 at the allotted positions are obtained In step S6, intersection points J and K between the normal N and the dot area innermost and outermost line L1 and L3 are obtained. A distance d between the points J and K is calculated (step S7). The distance d is divided by B−1 (where B is the number of dots within one unit pattern Q) to obtain a dot distance along the normal line direction. Coordinates of each dot are determined (step S8). The above operations are repeated to generate the dot allocation file 21.

As shown in FIG. 13, the center of the outermost dot (D5) is located on the intersection point K between the normal N and the dot area outermost line L3. As shown in FIG. 13, in order to allot the innermost dot (D1) in contact with the dot area innermost line L1, the value d in step S8 is given as d −r (where r is the radius of the innermost dot D1 and corresponds to the radius if a dot is a polygonal dot).

If the number of columns of the unit pattern normals N′ are obtained by equidistantly dividing intervals between the normals N in each unit pattern Q, as shown in FIG. 13. The positions of the dots D2 and D4 are obtained between the dot allotted positions (step S8) in the normal line direction.

One-dot data in the generated dot allocation file 21 consists of a dot serial number (six decimal digits), a reference number (1 to G) of the unit pattern to which the dot of interest belongs, a dot number (D1, D2,...) within one unit pattern Q, a column number (first column, second column,...) within one unit pattern Q, X- and Y-coordinates of the center of the dot of interest, and a dot pattern gradient (radian). The dot pattern gradient is data for orienting the abscissa or ordinate (e.g., Y-axis) used for inputting the outline of the dot in the normal line direction of the dot area reference line L2.

Data representing deformation of the pattern and data F1 and F2 representing deformation factors in the gradient direction and vertical direction to the gradient are included in data of each dot for corner portions of the glass. Thus, dot compression is performed in the normal line direction and the tangential line direction.

Figure 14:
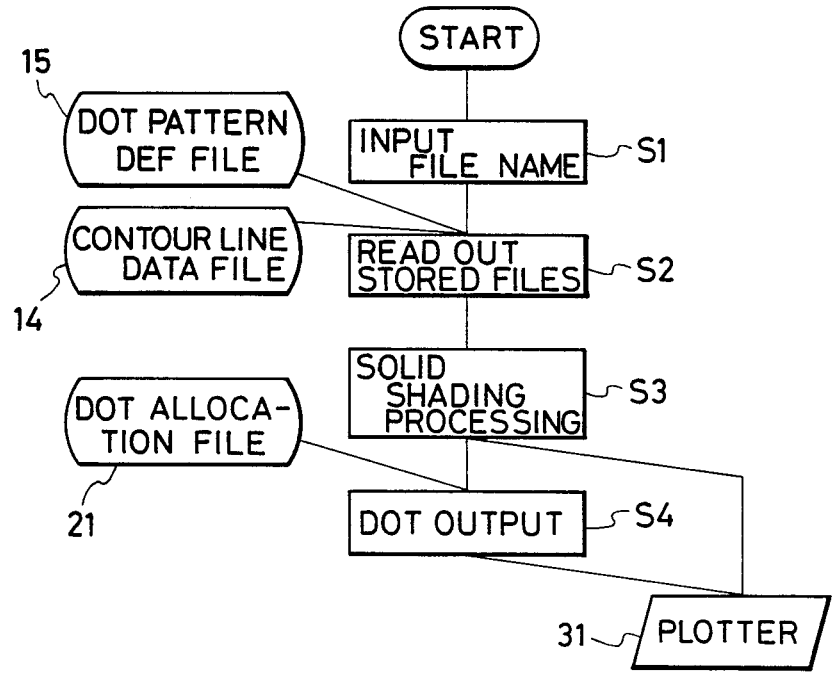
FIG. 14 is a flow chart for explaining a plotter output.

FIG. 14 is a flow chart showing a processing routine in the plotter output processor 30 shown in FIG. 1. A file name is input in step S1 and is defined as a name of the shading pattern output at the plotter. In step S2, the file data are read out from the dot pattern definition file 15 and the contour line data definition file 14 and are fetched in a memory. An instruction is output to the plotter 31 to perform solid area formation while the solid area between the line L3 (the dot area outermost line) and the line L4 (solid area outermost line) is divided into proper polygons (step S3). Dot allocation data are read from the dot allocation file 21 one by one, and the plotter 31 performs dot drawing in accordance with the read data and the dot pattern definition data.

In addition to the preferred embodiment described above, the present invention can be embodied in various specific forms. For example, if the outline of the plate glass can be expressed by a plurality of math. functions defined by dividing the outline into a plurality of segments, the outline and contour line data can be directly calculated by arithmetic operations using the functions instead of digitization by the digitizer. Furthermore, the dots in the shading area are large and small dots to express a density of the shading area. However, the density of identical dots may be varied to express the density of the shading area. In addition, the unit pattern may be constituted by a combination of different types of dots. The dot positions along the normals to the contour line need not be equidistantly allotted. Moreover, in this embodiment, the dots are allotted along the direction normal to the contour line. However, the dots may be allotted (oriented) along a line forming a predetermined angle, e.g., 45° with the normal.

According to the present invention as has been described above, dot patterns can be automatically produced along the reference line by using the dot outline data, the allocation data of the unit dot patterns each consisting of a small number of dots, and the reference line data obtained by one-dimensionally allotting the unit dot patterns. Special skills are not required, and a high-precision dot pattern can be produced within a very short period of time. An estimation sample may be easily generated so that design and specifications of the dot pattern can be easily modified as one likes.

What is claimed is:

1. An apparatus for drawing a dot pattern, comprising:

first definition means for giving outline data of a single dot to an output processor;

second definition means for giving dots allocation data to a shading pattern generator for defining a dots allocation for a unit dot pattern consisting of a small number of single dots to be located around an axis; and third definition means for giving reference line data representative of a reference line to said shading pattern generator which determines alignment of the unit dot pattern along the reference line; said shading pattern generator comprising:

first calculation means for receiving said reference line data, equidistantly dividing the reference line and determining normal line functions of normal lines to the reference line; and second calculation means for receiving data of said normal line functions and the dots allocation data of the unit dot patterns, determining two-dimensional coordinates of each dot, arranging unit dot patterns along the reference line with orientation of an axis of the unit dot patterns in directions of the normal lines or directions forming a predetermined angle with the normal lines, and feeding the two-dimensional coordinates to said output processor;

a drawing device receiving said two-dimensional coordinates and said outline data of said single dot and drawing a shading dot pattern along the reference line.

2. An apparatus according to claim 1, wherein the outline data of the single dot is defined as a set of straight lines of curved lines an an X-Y coordinate system.

3. An apparatus according to claim 1, wherein the single dot is a circle.

4. An apparatus according to claim 1, wherein the single dot is a polygonal dot.

5. An apparatus according to claim 1, wherein said second definition means for giving said dot allocation data further defines data representing the number of dots constituting the unit dot pattern, and data representing a pitch between the unit dot patterns, said dot allocation data being fed to the second calculation means for determination of coordinates of dots.

6. An apparatus according to claim 1 or 5, wherein said second definition means for giving the dot allocation data further defines data representing a reduction or magnification factor for each dot, said reduction or magnification factor being fed to said second calculation means for determination of a size of each dot to be drawn by said drawing device.

7. An apparatus according to claim 6, wherein the data representing the reduction or magnification factor are increased stepwise in a direction of said axis.

8. An apparatus according to claim 7, wherein the reference line is a loop which encircles a predetermined area and the single dots are reduced in size toward a center of the encircled area to provide a shading effect to the encircled area.

9. An apparatus according to claim 8, wherein said third definition means for giving the reference line data further defines innermost and outermost lines offset from the reference line, said unit dot patterns being arranged within a looped band defined with said innermost and outermost lines.

10. An apparatus according to claim 9, wherein said second calculation means for determining the two-dimensional coordinate data representing dot allocation calculates two-dimensional coordinates of divided points along the normal lines by dividing an interval between the innermost and outmost lines by a value obtained by subtracting one from the number of dots in the unit dot pattern.

11. An apparatus according to claim 1, wherein said third definition means for giving the reference line data comprises a digitizer for inputting coordinate data of a large number of sampling points on the reference line and an interpolator for generating the reference line data by performing linear or arc interpolation calculations between the sampling points 12. An apparatus according to claim 11, wherein said third definition means for giving the reference line data further defines data to designate the sampling points corresponding to start and end points of curved portions of the reference line each having a small radius of curvature, and dot compression factors for the curved portions, said data for designation of said curved portions and dot compression factors being fed to said second calculation means for determination of sizes of dots to be arranged along said curved portions.

13. An apparatus according to claim 1, wherein said means for forming the dot pattern on the drawing comprises an X-Y plotter.

14. An apparatus according to claim 1, wherein the dot pattern comprises an edging masking pattern with gradation along a periphery of a window glass of an automobile.

15. An apparatus according to claim 14, wherein said edging masking pattern comprises a long and narrow solid masking area along an edge of the window glass and a long and narrow dotted masking area inside the solid masking area, dot sizes being decreased stepwise from an outer side to an inner side of said dotted masking area.

* * * * *